(12) United States Patent
Datta et al.

(10) Patent No.: US 7,592,213 B2
(45) Date of Patent: Sep. 22, 2009

(54) TENSILE STRAINED NMOS TRANSISTOR USING GROUP III-N SOURCE/DRAIN REGIONS

(75) Inventors: Suman Datta, Beaverton, OR (US);
Justin K. Brask, Portland, OR (US);
Been-Yih Jin, Lake Oswego, OR (US);
Jack T. Kavalieros, Portland, OR (US);
Mantu K. Hudait, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 401 days.

(21) Appl. No.: 11/323,688

(22) Filed: Dec. 29, 2005

(65) Prior Publication Data
US 2007/0155063 A1 Jul. 5, 2007

(51) Int. Cl.
*H01L 21/336* (2006.01)
(52) U.S. Cl. .................. 438/197; 438/938; 438/933; 257/E21.632

(58) Field of Classification Search ............... 438/142, 438/199, 197, 938, 198, 200, 235, 191, 172, 438/FOR. 179; 257/E21.632, 200, 201, 204
See application file for complete search history.

(56) References Cited

U.S. PATENT DOCUMENTS

| 7,355,254 | B2 * | 4/2008 | Datta et al. ............... 257/382 |
| 2002/0117104 | A1 * | 8/2002 | Hata et al. ................. 117/97 |
| 2004/0041169 | A1 * | 3/2004 | Ren et al. .................. 257/192 |
| 2004/0155260 | A1 * | 8/2004 | Kuzmik ..................... 257/192 |
| 2005/0181536 | A1 * | 8/2005 | Tsuji ......................... 438/105 |

* cited by examiner

*Primary Examiner*—Jack Chen
*Assistant Examiner*—Matthew Reames
(74) *Attorney, Agent, or Firm*—Blakely, Sokoloff, Taylor & Zafman LLP

(57) ABSTRACT

Enhancement mode transistors are described where a Group III-N compound is used in the source and drain regions to place tensile strain on the channel. The source and drain regions may be raised or embedded, and fabricated in conjunction with recessed or raised compression regions for p channel transistors.

11 Claims, 3 Drawing Sheets

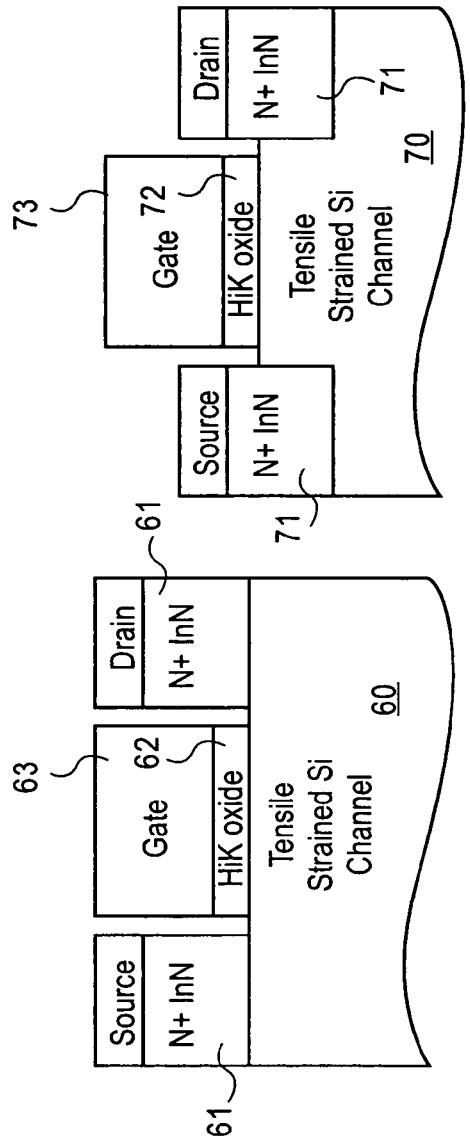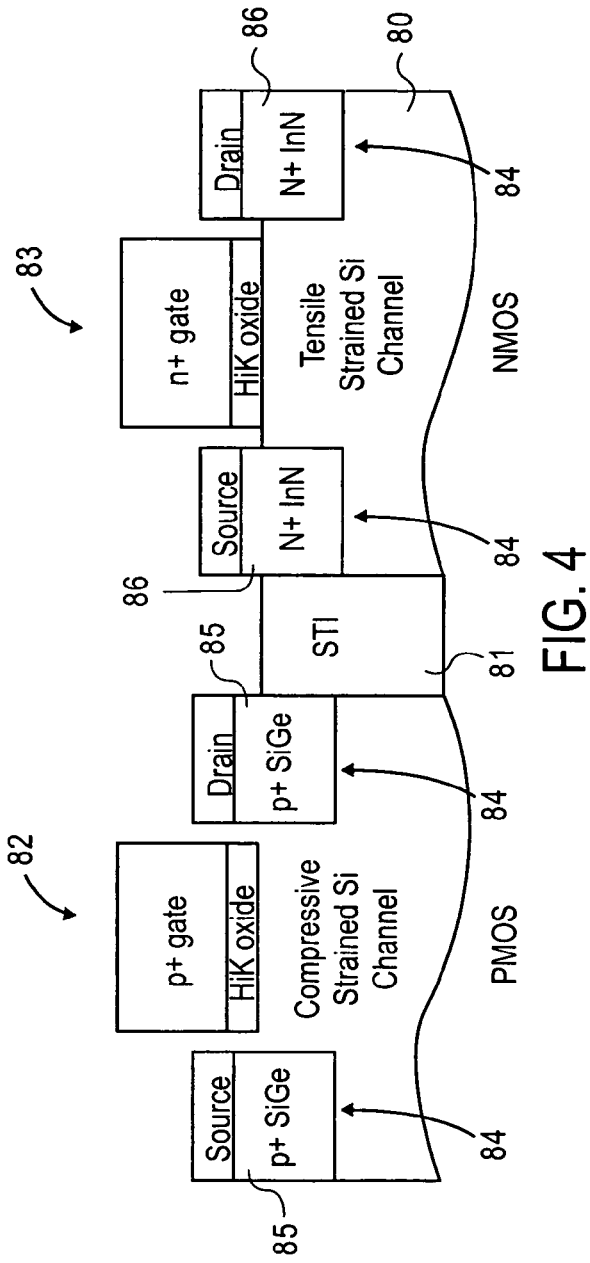

TENSILE STRAINED NMOS TRANSISTOR USING GROUP III-N SOURCE/DRAIN REGIONS

FIELD OF THE INVENTION

The invention relates to the field of transistors with strain and compression on channel regions.

PRIOR ART AND RELATED ART

It is recognized that improved performance in PMOS transistors is obtained when a uniaxial compressive strain is imparted directly to the channel of the transistors from, for instance, embedded silicon germanium (SiGe) source/drain regions. Similarly, it is known that increased performance is obtained in an NMOS transistor when uniaxial tensile strain is placed on its channel. In some cases this tensile strain is obtained from a silicon nitride capping layer, as will be discussed in conjunction with FIG. 1. Additionally, see "Sacrificial Capping Layer for Transistor Performance Enhancement," U.S. Ser. No. 11/174,230, filed Jun. 30, 2005.

BRIEF DESCRIPTION OF THE DRAWINGS

FIG. 2 is a cross-sectional, elevation view of a substrate showing one embodiment of placing strain on a channel region of an n channel.

FIG. 3 is a cross-sectional, elevation view of a substrate showing another embodiment for placing tensile strain on the channel region of an n channel.

FIG. 4 is a cross-sectional, elevation view of a substrate illustrating one embodiment for placing tensile strain on as n channel transistor in conjunction with the fabrication of a p channel transistor.

DETAILED DESCRIPTION

An n channel transistor and method of fabricating the transistor where tensile strain is placed on the silicon channel is described. In the following description, numerous specific details are set forth in order to provide a thorough understanding of the present invention. It will be apparent to one skilled in the art, that the present invention may be practiced without these specific details. In other instances, well-known structures and fabrication processes are not described in detail in order not to unnecessarily obscure the present invention.

Figure 1:
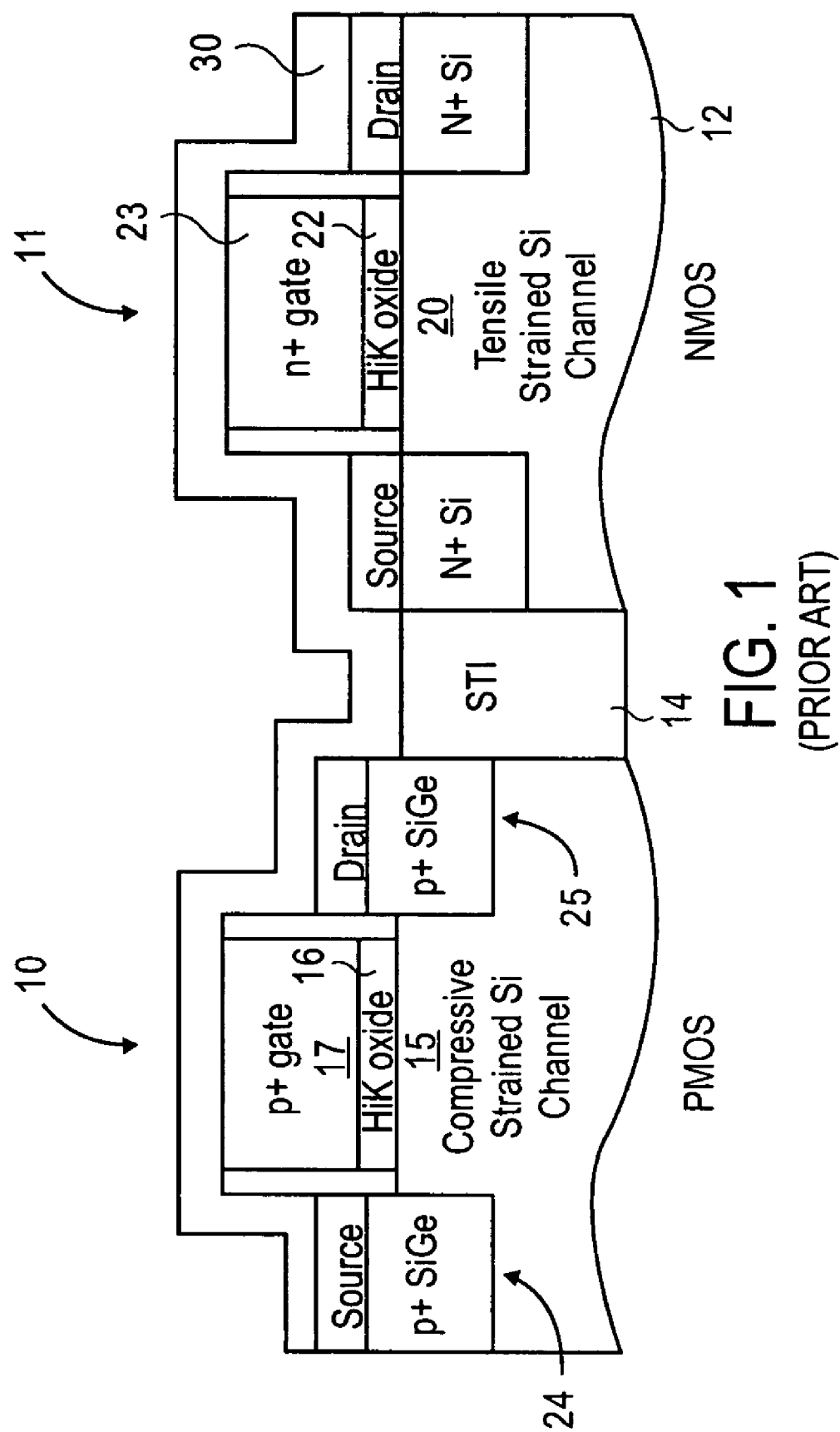
FIG. 1 is a cross-sectional, elevation view of a substrate showing a p channel and n channel field-effect transistor (FET) as fabricated in the prior art.

Referring first to the prior art of FIG. 1, a p channel transistor 10 and n channel transistor 11 are shown fabricated on a substrate 12. The transistors are separated by a shallow trench isolation region 14. The transistor 10 has a channel region 15 insulated from the gate 17 by, for instance, a high k oxide 16. Similarly, the channel region 20 of the transistor 11 is separated from the gate 23 by the high k oxide 22. In one embodiment, the gate oxides 16 and 22 are hafnium dioxide ($HfO_2$) or zirconium dioxide ($ZrO_2$). The gates 17 and 23 may be metal gates with work functions targeted such that a higher work function is used for the enhancement mode transistor 11, and a lower work function for the depletion mode transistor 10. In another embodiment, a silicon dioxide gate insulator is used with the gates fabricated from polysilicon.

As mentioned earlier, it is known that having the channel 15 of the transistor 10 in compression provides a better performing transistor. To this end, the substrate is etched at regions 24 and 25, and SiGe is epitaxially grown. The lattice mismatch between SiGe and Si causes the resultant source and drain regions to be in compression and thereby provides compression to the channel region 15. As shown in FIG. 1, the source and drain regions are doped with a p type dopant, such as boron.

To provide the tensile strain for the n channel transistor 11, a high tensile silicon nitride capping layer 30 is used to impart uniaxial tensile strain to the channel 20 through the source and drain regions of transistor 11. This high tensile strain capping layer, as shown in FIG. 1, also covers the p channel transistor and degrades its hole mobility somewhat, but not compared to the overall increase in performance obtained by placing the enhancement mode transistors in tensile stress.

As transistor densities continue to increase and gate pitch continues to decrease, there of course, is a reduction in contact area. This results in a relatively larger increase in the parasitic series resistance of the transistors, particularly the n channel transistors. The p channel transistors do not suffer as much from this scaling since the embedded SiGe source/drain regions and the lower barrier height associated with the silicide formed on these regions, provide lower series resistance.

As described below, a compound comprising a Group III element and nitride such as gallium nitride (GaN) and indium nitride (InN) is used in the source and drain regions to provide tensile strain on the channel for the n channel transistors. The Group III-N regions may be raised source/drain regions such as shown in FIG. 2, or embedded source/drain regions as shown in FIG. 3. The larger lattice mismatch between the Group III-N compound and silicon results in a highly tensile strain in the Group III-N film which results in a high tensile strain in the silicon channel, thereby enhancing electron mobility.

A benefit of using the Group III-N compound is the high electron mobility and high carrier concentration arising from polarization induced doping. For instance, in InN films with $\mu > 3,000$ $cm^2V^{-1}s^{-1}$, $R_{sheet}=27$ ohm/sq has been experimentally demonstrated. Low resistance ohmic contacts have also been demonstrated due to the very high surface electron accumulation resulting from Fermi level pinning. This is particularly beneficial for gate length and gate pitch scaling, as transistor density increases.

In the embodiments described below, InN is described as the Group III-N compound. As mentioned, other compounds such as GaN may be used. Moreover, the InN may be epitaxially grown on a step graded buffer layer of InGaN or GaN epitaxially grown on Si.

FIG. 2 illustrates one embodiment with an n channel transistor disposed on a monocrystalline substrate 60. The InN regions 61 are grown in an ordinary epitaxial process and doped with an n type dopant such as arsenic or phosphorous. The doping may occur during the growth of the regions or subsequently through, for example, ion implantation. In FIG. 2 the regions 61 are disposed on the substrate, that is, they are not recessed but rather are raised source and drain regions. Note that the regions 61 in FIG. 2 and like regions in the other figures are spaced apart from the oxide 62 and gate 63. This illustrates the use of sidewall spacers typically used after the formation of the extension, or tip, source and drain regions, and before the formation of the main source and drain regions.

FIG. 3 shows another embodiment, where prior to the formation of the source and drain regions, selective etching of the substrate 70 occurs to allow subsequent growth of embedded regions 71. This embedding is what is shown in FIG. 1 for the SiGe regions. The embedded source and drain region 71 disposed in the substrate 70 of FIG. 3 are again spaced apart from the oxide 72 and gate 73.

In both FIGS. 2 and 3, because of the lattice mismatch between the silicon and the InN, the InN regions are in tension which produces corresponding tension in the channel regions of the n channel transistors.

In all the figures, it will be appreciated that with a replacement gate process, a dummy gate and an insulator other than a high k insulator may be present when the source/drain regions are grown. The dummy gate is replaced with a metal gate after the source/drain regions are grown for this process.

In FIG. 4, one embodiment is shown for integrating the Group III-N source/drain regions into an integrated circuit having depletion mode transistors with compressive strained channels. A substrate 80, separated into two regions by a shallow trench isolation region 81, is illustrated. One region includes a p channel transistor 82, and the other, an n channel transistor 83. In a typical process after the gates and spacers are formed for the transistors, selective etching occurs to etch the silicon substrate to provide recesses for all the source and drain regions as indicated by 84. As mentioned earlier, the gates at this point in the processing may be dummy gates. Then, one of the p channel and n channel transistor regions are covered while the appropriate source/drain regions are grown at the other regions.

For instance, referring to FIG. 4 after the formation of the recesses 84, the n channel transistor regions are covered with a photoresist. Then, the SiGe 85 is grown and doped with a p type dopant. Following this, the p channel transistors are covered allowing the InN regions 86 to be epitaxially grown and doped to provide the recess source and drain regions for the enhancement mode transistors, as shown in FIG. 4.

Note in FIG. 4 the gates are shown as p+ or n+. This is used to indicate that where polysilicon gates are used, the gates are doped, for example, when the source and drain regions are doped. Where metal gates are used, the p+ and n+ is used to indicate the targeted work function for the metal appropriate for either an enhancement mode or depletion mode transistor.

Figure 5:
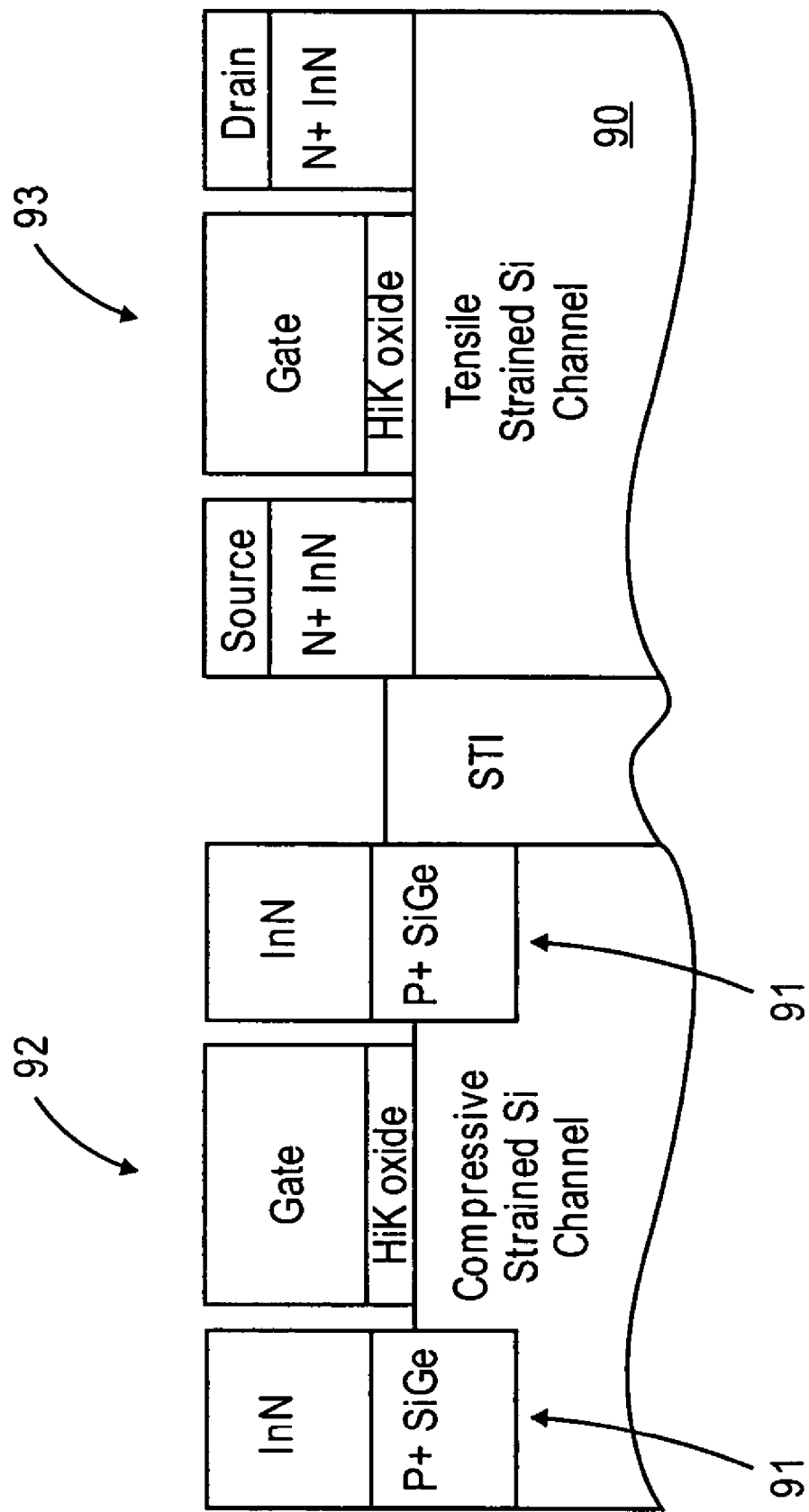
FIG. 5 is a cross-sectional, elevation view of a substrate showing another embodiment for placing tensile strain on an n channel transistor when fabricated in conjunction with a p channel transistor.

FIG. 5 illustrates another embodiment where the InN source and drain regions are integrated into all the CMOS transistors. Fewer masking steps are required for the embodiment of FIG. 5 when compared to the embodiment of FIG. 4.

First, the regions for the n channel transistors may be covered after the gates (or dummy gates) are formed. Then, the substrate 90 is etched at the proposed locations of the source and drain regions for the p channel transistors as indicated by regions 91. This allows a subsequent growth of the SiGe at these regions for recessed p+ SiGe source and drain regions. As indicated in FIG. 5, this places compressive strain on the silicon channels of the depletion mode transistors.

Following this, InN is selectively grown on all the source and drain regions. That is, it is grown both on the SiGe and on the Si, adjacent the gates of the n channel transistors, as shown for transistors 92 and 93 of FIG. 5. This results in tensile strain on the silicon channel of the n channel transistor. The InN on the SiGe does degrade hole mobility to some extent in transistor 92, but not significantly enough to overcome the benefit of the SiGe regions.

Other combinations of recessed and raised source and drain regions are possible. For example, InN regions may be recessed while the SiGe regions are not recessed. In another embodiment, the InN regions can be recessed and the SiGe grown for raised source and drain regions for the p channel transistors, and simultaneously grown on the embedded InN source and drain regions of the n channel transistors.

Thus, n channel transistors have been described where tensile strained channels are formed using a Group III-N compound. The resultant source and drain regions may be raised or recessed, and formed in conjunction with compressive source and drain regions for p channel transistors.

What is claimed is:

1. A method for fabricating a pair of transistors, comprising:
    forming Group III-N regions adjacent a channel region;
    doping the Group III-N regions with an n type dopant to provide an n channel transistor;
    forming a p channel transistor; and
    forming SiGe regions adjacent a channel region of the p channel transistor.

2. The method of claim 1, wherein the Group III-N regions are InN regions.

3. The method of claim 1, wherein the Group III-N regions are recessed into a silicon substrate.

4. The method of claim 1, wherein the Group III-N regions are raised from a silicon substrate.

5. The method of claim 1, including recessing the SiGe regions into a silicon substrate.

6. The method of claim 1, wherein the SiGe regions are raised from a silicon substrate.

7. The method of claim 2, including growing the InN regions on a step graded buffer region of GaN formed on a silicon substrate.

8. A method for fabricating a pair of transistors, comprising:
    forming tensilely stressed regions of a Group III-N material adjacent a channel region;
    doping the Group III-N material with an n type dopant to provide an n channel transistor;
    forming a p channel transistor; and
    forming SiGe regions adjacent a channel region of the p channel transistor.

9. The method of claim 8, wherein the Group III-N material comprises InN.

10. The method of claim 9, including recessing the InN material into a silicon substrate.

11. The method of claim 9, wherein the InN material is raised from a silicon substrate.

* * * * *

UNITED STATES PATENT AND TRADEMARK OFFICE
CERTIFICATE OF CORRECTION

PATENT NO. : 7,592,213 B2  Page 1 of 1
APPLICATION NO. : 11/323688
DATED : September 22, 2009
INVENTOR(S) : Datta et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 627 days.

Signed and Sealed this

Twenty-first Day of September, 2010

David J. Kappos
*Director of the United States Patent and Trademark Office*